US007029984B2

(12) United States Patent
Horii et al.

(10) Patent No.: US 7,029,984 B2
(45) Date of Patent: Apr. 18, 2006

(54) METHOD FOR FABRICATING SEMICONDUCTOR DEVICE

(75) Inventors: Yoshimasa Horii, Kawasaki (JP); Masaaki Nakabayashi, Kawasaki (JP); Masaki Kurasawa, Kawasaki (JP); Kou Nakamura, Kawasaki (JP); Kazuaki Takai, Kawasaki (JP); Hideyuki Noshiro, Kawasaki (JP); Shigeyoshi Umemiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/136,564

(22) Filed: May 25, 2005

(65) Prior Publication Data

US 2005/0215006 A1    Sep. 29, 2005

Related U.S. Application Data

(63) Continuation of application No. PCT/JP03/07202, filed on Jun. 6, 2003.

(51) Int. Cl.
*H01L 21/8242* (2006.01)

(52) U.S. Cl. ............... 438/396; 438/239; 438/250; 438/253; 438/393

(58) Field of Classification Search ............. 438/210, 438/239, 250, 253, 393, 396, FOR 220, FOR 430
See application file for complete search history.

(56) References Cited

U.S. PATENT DOCUMENTS 5,757,061 A   5/1998  Satoh et al.

| | | | |
|---|---|---|---|
| 6,682,772 B1* | 1/2004 | Fox et al. ................. 427/79 |
| 2002/0102791 A1* | 8/2002 | Kurasawa et al. ........ 438/240 |
| 2003/0022454 A1* | 1/2003 | Wang et al. .............. 438/381 |
| 2003/0062554 A1* | 4/2003 | Sakurai et al. ........... 257/295 |
| 2003/0133250 A1* | 7/2003 | Norga et al. ............. 361/311 |

FOREIGN PATENT DOCUMENTS

| EP | 0 747 937 A2 | 12/1996 |
|---|---|---|
| JP | 5-343642 | 12/1993 |
| JP | 2002-208678 | 7/2002 |
| JP | 2002-212129 | 7/2002 |
| JP | 2003-68991 | 3/2003 |
| JP | 2003-133531 | 5/2003 |

OTHER PUBLICATIONS

Yoshimasa Horii et al.; "4 Mbit embedded FRAM for high performance System on Chip (SoC) with large switching charge, reliable retention and high imprint resistance", 2002 IEEE.

* cited by examiner

*Primary Examiner*—George Fourson
*Assistant Examiner*—Joannie Adelle Garcia
(74) *Attorney, Agent, or Firm*—Westerman, Hattori, Daniels & Adrian, LLP

(57) ABSTRACT

A method is disclosed for fabricating a semiconductor device having a memory employing a ferroelectric capacitor in which the orientation of the ferroelectric film is controlled. The method for fabricating the semiconductor device includes a first film deposition process for forming a first ferroelectric layer, and a second film deposition process for forming a second ferroelectric layer on the first ferroelectric layer. The film deposition temperature of the first film deposition process is set to at least 600° C.

18 Claims, 12 Drawing Sheets

METHOD FOR FABRICATING SEMICONDUCTOR DEVICE

CROSS REFERENCE TO RELATED APPLICATIONS

This application is a U.S. continuation application filed under 35 USC 111(a) claiming benefit under 35 USC 120 and 365(c) of PCT application JP2003/007202, filed on Jun. 6, 2003, the entire contents of which are hereby incorporated herein by reference.

BACKGROUND OF THE INVENTION

1. Field of the Invention

The present invention relates to a method for fabricating a semiconductor device including a ferroelectric capacitor.

2. Description of the Related Art

In recent years and continuing, attention is being directed to a ferroelectric memory employing a ferroelectric capacitor as a high-speed low-power nonvolatile memory, and research and development are being vigorously conducted relating to this field. It is noted that a planar type ferroelectric capacitor has conventionally been used in a ferroelectric memory capacitor as is described above. However, use of a ferroelectric capacitor having a stacked capacitor structure is being contemplated to realize high integration of ferroelectric capacitors.

It is noted that a ferroelectric film implemented in a stacked capacitor needs to have good step coverage, and be made of high density crystal with a low leak current in order to realize a three-dimensional capacitor structure.

Accordingly, in forming a ferroelectric film implemented in a stacked capacitor, the MOCVD (Metal Organic Chemical Vapor Deposition) method that is capable of realizing good step coverage and a high density crystal is preferably used over other methods such as the sol-gel method or the sputtering method. In turn, the MOCVD method is presently being regarded as the next generation film deposition method.

FIGS. 1A~1G illustrate process steps for fabricating a semiconductor device including a ferroelectric memory having a stacked capacitor structure.

Referring to FIG. 1A, a well region 103 corresponding to an impurity dispersion region that is isolated by an isolation film 102 is formed on a substrate 101 that is made of Si. In the well region 103, low concentration impurity dispersion regions 106 and high concentration impurity dispersion regions 107 are formed in a manner such that the low concentration impurity dispersion regions 106 cover the high concentration impurity dispersion regions 107.

Also, a channel region 104 is formed in between two low concentration impurity dispersion regions 106 formed within the well region 103. A gate electrode 108 that may be made of polysilicon, for example, is formed on the upper side of the channel region 104 via a gate dielectric film 105. A side wall insulating film 110 is formed at the side wall of the gate electrode 108, and an insulating film 109 is formed on the upper portion of the gate electrode 108. Further, an insulating film 111 is formed to cover the side wall insulating film 110, the insulating film 109, and the high concentration impurity dispersion regions 107, and an interlayer insulating film 112 is formed to cover the insulating film 111. In this way, a MOS transistor 200 is formed.

As is shown in FIG. 1A, two MOS transistors 200 may be formed within the well region 103, for example. Also, contact plugs 113 covered by barrier films 113a that are electrically connected to the high concentration impurity dispersion regions 107 are formed between the two MOS transistors 200 and between the MOS transistor and the isolation film 102 within the interlayer insulating film 112.

Next, in the process illustrated by FIG. 1B, an Ir film 114a for realizing a lower electrode of the capacitor is formed on top of the interlayer insulating film 112, and then, a Pb(Zr$_x$, Ti$_{1-x}$)O$_3$ film (PZT film) 115a is formed on the Ir film 114a through the MOCVD (Metal Organic Chemical Vapor Deposition) method. In forming the PZT film 115a through the MOCVD method, for example, organic metal gas and oxide gas as source gases may be supplied to the substrate 101 that is thermally processed so that the organic metal gas may be thermally decomposed and an oxidative reaction may occur between the organic metal gas and the oxide gas. In this way, the PZT film 115a may be formed on the Ir film 114a.

It is noted that source gas including Pb, source gas including Zr, and source gas including Ti, for example, may be used as the organic metal gas, and oxygen may be used as the oxide gas.

Then, an IrOx film 116a for realizing an upper electrode of the capacitor is formed on the PZT film 115a.

Next, in the process as is illustrated in FIG. 1C, an etching process is conducted on the IrOx film 116a, the PZT film 115a and the Ir film 114a to form a ferroelectric capacitor 130 including a lower electrode 114 that is made of Ir, a ferroelectric film 115 that is made of PZT, and an upper electrode that is made of IrOx.

Next, in the process as is illustrated in FIG. 1D, a protective film 117 is formed to cover the ferroelectric capacitor 130 and the interlayer insulating film 112. Then, in the process as is illustrated in FIG. 1E, an interlayer film 118 is formed to cover the protective film 117.

Next, in the process as is illustrated in FIG. 1F, a contact hole is formed at the interlayer insulating film 118, and a contact plug 120 covered by a barrier film 12a is formed to be electrically connected to the contact plug 113 provided between the two MOS transistors 200.

Next, in the process as is illustrated in FIG. 1G, a contact hole that comes into contact with the upper electrode 116 is formed at the interlayer insulating film 118, and a wiring layer including a wiring portion 119 that is covered by barrier layers 119a and 119b is formed to be electrically connected to the upper electrode 116 and the contact plug 120. Then, by forming a multilayer wiring structure that is connected to the above wiring layer, a semiconductor device including a ferroelectric memory is formed.

It is noted that the characteristics of the ferroelectric capacitor 130 that is formed in the above-described manner are largely dependent on the ferroelectric characteristics of the ferroelectric film 115. The ferroelectric characteristics of the ferroelectric film 115 depend on the orientation of the PZT crystal of the ferroelectric film 115, and the ferroelectricity of the ferroelectric film 115 may be maximized (i.e., a maximum switching charge Qsw may be obtained) when the PZT crystal has a (001) orientation.

On the other hand, ferroelectricity may not be achieved when the PZT crystal is (100) oriented. Generally, the PZT crystal of the ferroelectric film 115 belongs to the tetragonal crystal system, and thereby, the lattice constant of the c axis direction is different from the lattice constants of the a axis direction and the b axis direction. However, in practice, the difference in the lattice constants is very small so that when attempts are made to direct the PZT crystal in the (001) orientation, the PZT crystal may equally be directed in the (100) orientation with the same probability. Accordingly, a technique is proposed for increasing the proportion of the (111) oriented PZT crystals. Although this leads to degradation of the ferroelectricity of the ferroelectric film, the overall intrinsic polarization of the ferroelectric film may be increased, good imprint characteristics may be achieved, and reliability in the ferroelectric memory may be improved according to this technique.

It is known that in order to increase the proportion of (111) oriented PZT crystals, the temperature of the film deposition process for forming the PZT film must be set to at least 600° C. (e.g., see Horii et al., IEDM Technical Digest, 2002, p. 529).

FIG. 2 is a graph representing X ray analysis profiles of PZT films formed on the Ir film at different film deposition temperatures using the MOCVD method as is described in relation to FIG. 1B. In FIG. 2, results of forming the PZT film at temperatures of 450° C., 500° C., 550° C., 580° C., and 620° C. are represented as experiments E1, E2, E3, E4, and E5, respectively. In FIG. 2, peak P1 represents a (100) orientation in the PZT film, peak P2 represents a (101) orientation in the PZT film, and peak P3 represents a (111) orientation in the PZT film.

It is noted that peak Ps and peak Pi of FIG. 2 represent the (111) orientations of Si and Ir, respectively.

First, in the experiment E1 of FIG. 2, neither the peak P1 representing the (100) orientation in the PZT film, the peak P2 representing the (101) orientation in the PZT film, nor the peak P3 representing the (111) orientation in the PZT film can be seen. Accordingly, it may be understood that when the film deposition temperature is below 500° C. (e.g., 450° C.), the PZT film is formed into a non-crystalline state.

Next, in the experiments E2~E4, although the peak P1 representing the (100) orientation in the PZT film and the peak P2 representing the (101) orientation in the PZT film can be seen, the peak P3 representing the (111) orientation in the PZT film cannot be found. Thus, it may be understood that in a case where the film deposition temperature is at least 500° C. but less than 600° C., the crystallization of the PZT is in progress but the (111) orientation is still not formed.

Next, referring to experiment E5 of FIG. 2, when the film deposition temperature for forming the PZT film is greater than or equal to 600° C. (e.g., 620° C.), the (111) orientation may be found in the PZT film. As can be appreciated from the above experiment results, in the MOCVD method, the (111) orientation ratio in the PZT film may be increased when the film deposition temperature for forming the PZT film is greater than or equal to 600° C.

On the other hand, according to research conducted on which the present invention is based, it is known that when the PZT film is formed at a film deposition temperature of 600° C. or higher, the adhesion rate of the organic metal source gas to the substrate decreases, and thereby, the deposition speed of the PZT film decreases.

FIG. 3 is a graph representing the substrate adhesion rates of organic metal source gases for forming the PZT film in relation to the film deposition temperature. In FIG. 3, the adhesion rates of a source gas including Pb, a source gas including Zr, and a source gas including Ti are shown as examples of organic metal source gases for forming the PZT film.

As is shown in FIG. 3, for each of the source gas including Pb, the source gas including Zr, and the source gas including Ti, the adhesion rate with respect to the substrate decreases as the film deposition temperature is increased. For example, when the film deposition temperature is at 620° C., the adhesion rate with respect to the substrate is decreased compared to the case in which the film deposition temperature is between the range of 500~550° C.

This effect is a result of the decomposition of the metal organic gas in the vapor phase which reduces the amount of the metal organic gas being adhered to the substrate. In turn, the amount of decomposition products of the source gas such as particles generated in the vapor phase is increased; that is, the amount of impurities generated in the film deposition process is increased. When such impurities are included in the PZT film, local degradation of ferroelectric characteristics in the PZT film may occur, and the switching charge at bits including particles may be degraded thereby leading to decrease in the yield.

Also, in forming the PZT film, when the film deposition temperature is greater than or equal to 600° C., Pb, which has a high vapor pressure, is particularly prone to separation, and with the separation of Pb, separation of oxygen occurs. Thus, crystal defects such as a Pb deficit and/or an O (oxygen) deficit within the PZT film may be increased.

When the amount of crystal defects is increased, the leak current of the PZT film is increased, and fatigue characteristics of the ferroelectric capacitor using the PZT film are degraded.

SUMMARY OF THE INVENTION

Accordingly, it is a general object of the present invention to provide a novel and useful method for fabricating a semiconductor device that resolves one or more of the problems of the related art.

It is a more specific object of the present invention to provide a method for fabricating a semiconductor device including a memory employing a ferroelectric capacitor, the method involving controlling the orientation of a ferroelectric film to maintain good ferroelectric characteristics in the ferroelectric film while reducing impurities and crystal defects within the ferroelectric film and securing a high film deposition speed.

According to an aspect of the present invention, a method for fabricating a semiconductor device including a ferroelectric capacitor is provided, the method including:

a lower electrode forming step for forming a lower electrode of the ferroelectric capacitor;

a first film deposition step for forming a first ferroelectric film primarily having a (111) orientation on the lower electrode through a vapor deposition process using an organic metal source;

a second film deposition step for forming a second ferroelectric film primarily having a (111) orientation on the first ferroelectric film through a vapor deposition process using an organic metal source; and an upper electrode forming step for forming an upper electrode on the second ferroelectric film; wherein the first ferroelectric film and the second ferroelectric film include at least one of $Pb(Zr_x, Ti_{1-x})O_3$ (PZT) and $PbTiO_3$ (PT); and the film deposition temperature in the first film deposition step is set to be greater than or equal to 600° C.

According to an embodiment of the present invention, a ferroelectric structure including PZT or PT of a ferroelectric capacitor is formed by the first ferroelectric film that is formed in the first film deposition step and the second ferroelectric film that is formed in the second ferroelectric film, and the film deposition temperature for forming the first ferroelectric film in the first film deposition step is set to be greater than or equal to 600° C. so that the (111) orientation ratio of the first ferroelectric film may be increased and the (111) orientation ratio of the second ferroelectric film formed on the first ferroelectric film in the second film deposition step may also be increased.

According to an embodiment of the present invention, even when the film deposition temperature of the second film deposition step is set to be less than 600° C. to reduce impurities and crystal defects in the second ferroelectric film, a high (111) orientation ratio may still be obtained in the second ferroelectric film. A ferroelectric structure that is made of the first ferroelectric film and the second ferroelectric film that are formed in the above described manner may be arranged to have a high (111) orientation ratio, good ferroelectric characteristics, little impurities, and few crystal defects so that a high quality ferroelectric capacitor may be realized.

According to an embodiment of the present invention, the film deposition temperature in the second film deposition step is set to be greater than or equal to 500° C. and less than 600° C. to reduce impurities and crystal defects in the second ferroelectric film being formed. According to an aspect, by setting the film deposition temperature of the second film deposition step to be greater than or equal to 500° C. and less than 600° C., reaction in the vapor phase of an organic metal gas as the source of the second ferroelectric film may be prevented, and the amount of impurities such as particles generated by the reaction in the vapor phase and decomposition products in the vapor phase being integrated into the second ferroelectric film may be reduced.

According to another aspect, by setting the film deposition temperature of the second deposition step to be greater than or equal to 500° C. and less than 600° C., separation of Pb and O from the second ferroelectric film being formed may be prevented so that crystal defects such as a Pb deficit and an O deficit may be reduced in the second ferroelectric film, and thereby, a ferroelectric film with a low leak current may be realized.

According to another embodiment of the present invention, the film deposition temperature of the second film deposition step is set to be greater than or equal to 400° C. and less than 500° C. to further reduce impurities and crystal defects in the second ferroelectric film being formed. According to an aspect, by setting the film deposition temperature of the second film deposition step to be greater than or equal to 400° C. and less than 500° C., reaction in the vapor phase of an organic metal gas as the source of the second ferroelectric film may be prevented, and the amount of impurities such as particles generated by the reaction in the vapor phase and decomposition products in the vapor phase being integrated into the second ferroelectric film may be reduced.

According to a further embodiment of the present invention, an annealing process is conducted to crystallize a non-crystalline second ferroelectric film that is formed in the second film deposition step at a film deposition temperature of 400~500° C. According to an aspect, by forming a non-crystalline second ferroelectric film and conducting a crystallization process thereon, the time duration for heating the second ferroelectric film to a high temperature may be reduced compared to the case of forming a crystallized second ferroelectric film at a higher film deposition temperature, and the amount of heat applied to the semiconductor device including the second ferroelectric film may be reduced so that damage inflicted on the semiconductor device such as a MOS transistor due to heat may be reduced.

DESCRIPTION OF THE PREFERRED EMBODIMENTS

In the following, preferred embodiments of the present invention are described with reference to the accompanying drawings.

According to an embodiment of the present invention, in forming a ferroelectric film of a ferroelectric capacitor used in a semiconductor device, a first film deposition step and a second film deposition step are conducted. In such a case, the film deposition temperature is changed between the first film deposition step and the second film deposition step so that good ferroelectric characteristics may be maintained within the ferroelectric film being formed while reducing impurities and crystal defects in the ferroelectric film.

For example, in the case of forming the ferroelectric film using the MOCVD method, by setting the film deposition temperature for forming the PZT film to 600° C. or higher in the first film deposition step, the (111) orientation ratio in the PZT film may be increased. In this way, the self polarization rate of the PZT film may be increased and good ferroelectric characteristics may be obtained. Also, good imprint characteristics may be realized so that the reliability of the memory implementing the PZT film may be improved.

However, when the film deposition temperature for forming the PZT film is 600° C. or higher, organic metal source gas that is supplied to the substrate of the semiconductor device for forming the PZT film may be decomposed in the vapor phase, and particles and decomposition products may be integrated into the PZT film, for example. Also, when the film deposition temperature is set to a high temperature of 600° C. or above, a Pb deficit or an O deficit may be easily created due to separation of Pb or O, and crystal defects may increase, leading to an increase in the leak current of the PZT film.

Accordingly, by setting the film deposition temperature to be greater than or equal to 500° C. but less than 600° C. in the second film deposition step, reaction of the organic metal source gas in the vapor phase may be reduced and the amount of decomposition products may be reduced so that impurities within the PZT film may be reduced. Also, since a PZT film with a high (111) orientation ratio is formed in the first film deposition step, in the second film deposition step the high (111) orientation ratio in the PZT film may be maintained to form a PZT film with a high (111) orientation ratio.

FIRST EMBODIMENT

In the following, a method for fabricating a semiconductor device including a ferroelectric capacitor according to a first embodiment of the present invention is described with reference to FIGS. 4A–4I.

Figure 4A:
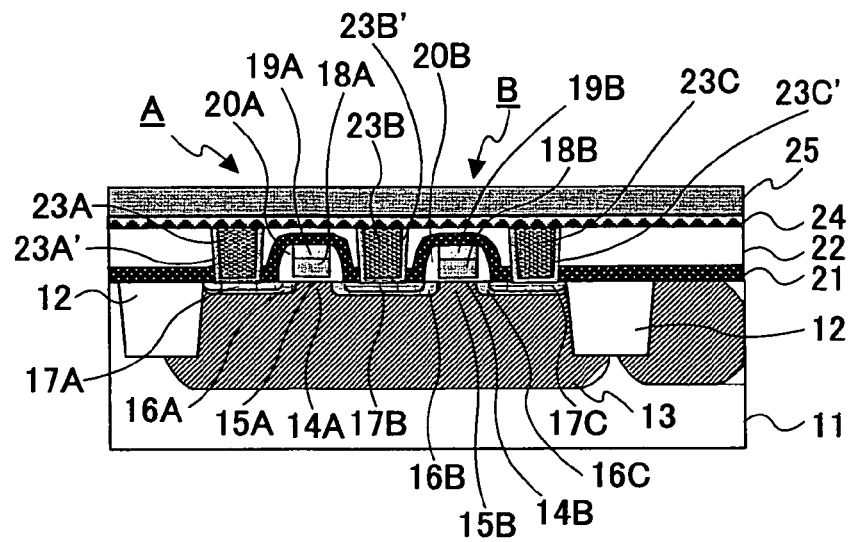
FIGS. 4A~4I are diagrams illustrating process steps of a method for fabricating a semiconductor device including a ferroelectric capacitor according to a first embodiment of the present invention.

First, referring to FIG. 4A, an isolation film 12 is formed on a substrate 11 that is made of Si, and a well region 13 that is isolated by the isolation film 12 is formed. In the well region 13, low concentration impurity dispersion regions 16A, 16B, and 16C are formed, and high concentration impurity dispersion regions 17A, 17B, and 17C are formed within the low concentration impurity dispersion regions 16A, 16B, and 16C, respectively.

A channel region 14A is formed between the low concentration impurity dispersion regions 16A and 16B, and a gate insulating film 15A is formed on the channel region 14A. Then, on the gate insulating film 15A, a gate electrode 18A made of polysilicon, for example, and having an insulating film 19A covering its top portion is formed, and a side wall insulating film 20A is formed. In this way, a MOS transistor A is formed.

Also, a channel region 14B is formed between the low concentration impurity dispersion regions 16B and 16C, and a gate insulating film 15B is formed on the channel region 14B. On the gate insulating film 15B, a gate electrode 18B made of polysilicon, for example, and having an insulating film 19B covering its top portion is formed, and a side wall insulating film 20B is formed. In this way a MOS transistor B is formed.

Then, an insulting film 21 is formed to cover the isolation region 12, the high concentration impurity dispersion regions 17A, 17B, and 17C, the side wall insulating films 20A and 20B, and the insulating films 19A and 19B; then an interlayer insulting film 22 made of a silicon oxide film or a phospho-silicate glass film, for example, is formed to cover the insulating film 21.

Then, contact holes are formed on the interlayer insulating film 22, and a contact plug 23A including a barrier film 23A', a contact plug 23B including a barrier film 23B', and a contact plug 23C including a barrier film 23C are formed and electrically connected to the high concentration impurity dispersion regions 17A, 17B, and 17C, respectively.

Then, to form a ferroelectric capacitor on the interlayer insulating film 22 formed on the MOS transistors A and B, first, a Ti film 24 and an Ir film 25 for forming a lower electrode are deposited using the reactive sputtering method, for example. By arranging the lower electrode corresponding to the base for forming the PZT film to have an Ir/Ti structure, the (111) orientation in the PZT film may be easily formed. According to an embodiment, first, Ti in which the (111) orientation may be easily formed is supplied to form the (111) orientation of Ti. In this way, the (111) orientation of Ir may be easily formed. Also, the lattice spacing value of the (111) orientation of Ir is close to the lattice spacing value of the (111) orientation of PZT so that the (111) orientation of the PZT may be easily formed. It is noted that in an alternative embodiment, the lower electrode may be formed by an Al oxide film and an Ir film.

Figure 4B:
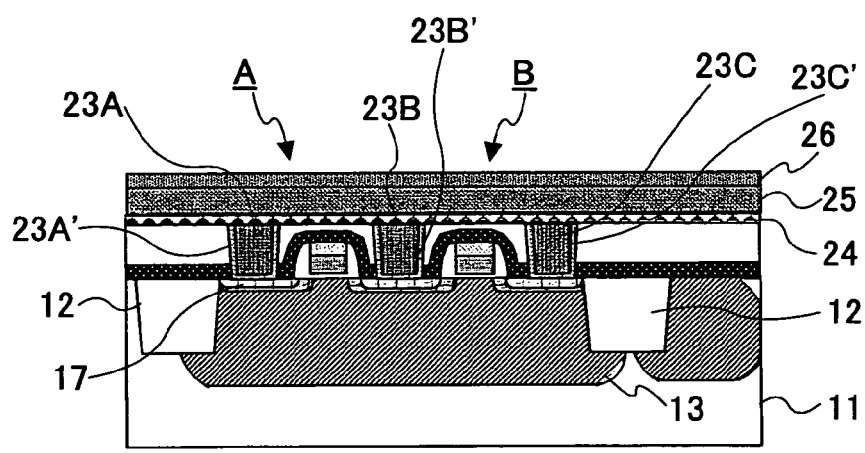

Next, referring to FIG. 4B, a first ferroelectric film 26 made of a PZT film, for example, is formed in a first film deposition step for forming a ferroelectric film using the MOCVD method. In this example, $Pb(DPM)_2$, $Zr(dmhd)_4$, and $Ti(O-iPr)_2(DPM)_2$, are used as a source including Pb, a source including Zr, and a source including Ti, respectively.

Each of the sources is dissolved by a solvent of THF (tetrahydrofuran) to a molar ratio concentration of 3% to create a source liquid, and the source liquid is vaporized by a vaporizer at a temperature of 260° C. and is mixed with oxygen to create a source gas. The source gas may be supplied to the substrate 11 via a source gas supply system having a shower head structure, for example.

In the film deposition process according to the present example, the source including Pb is supplied at 0.365 ml/min, the source including Zr is supplied at 0.196 ml/min, and the source including Ti is supplied at 0.175 ml/min for a period of 20 seconds.

Figure 1A:
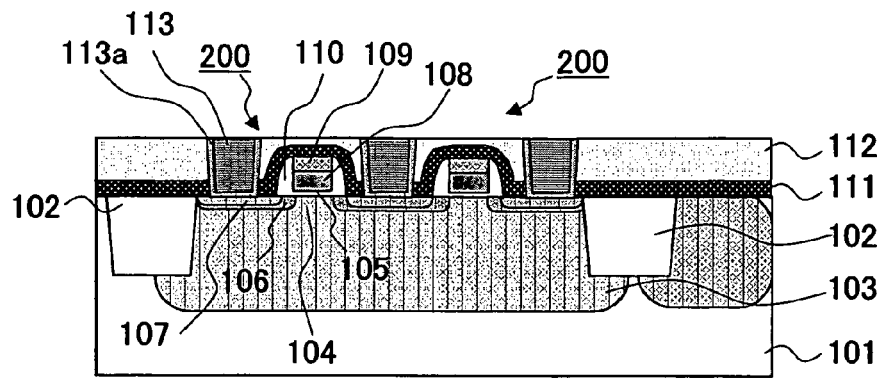
FIGS. 1A~1G are diagrams illustrating process steps of a method for fabricating a semiconductor device including a ferroelectric capacitor having a stacked capacitor structure.
Figure 1B:
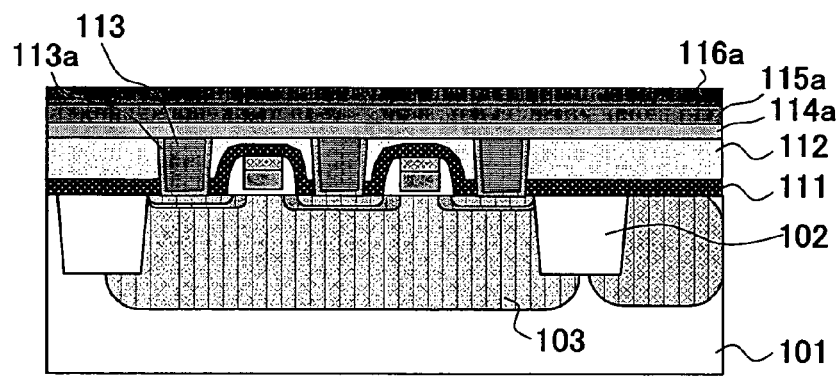
Figure 1C:
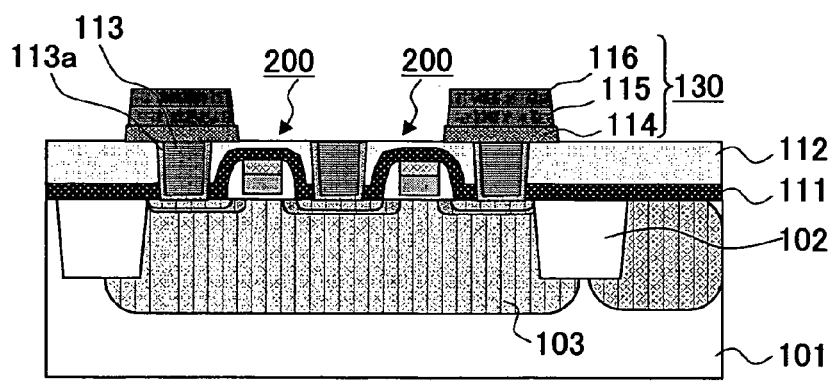
Figure 1D:
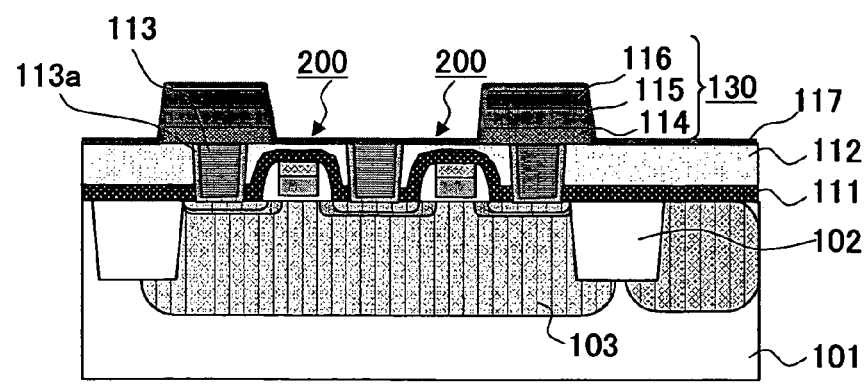
Figure 1E:
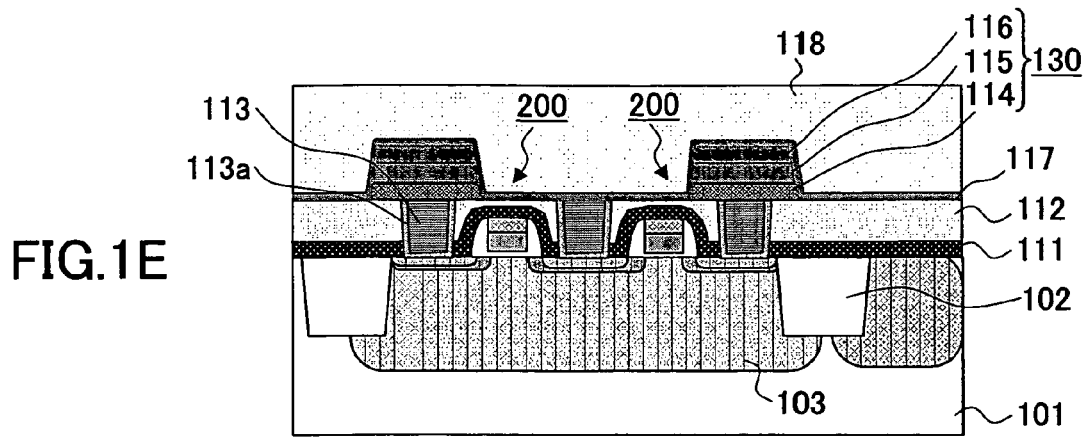
Figure 1F:
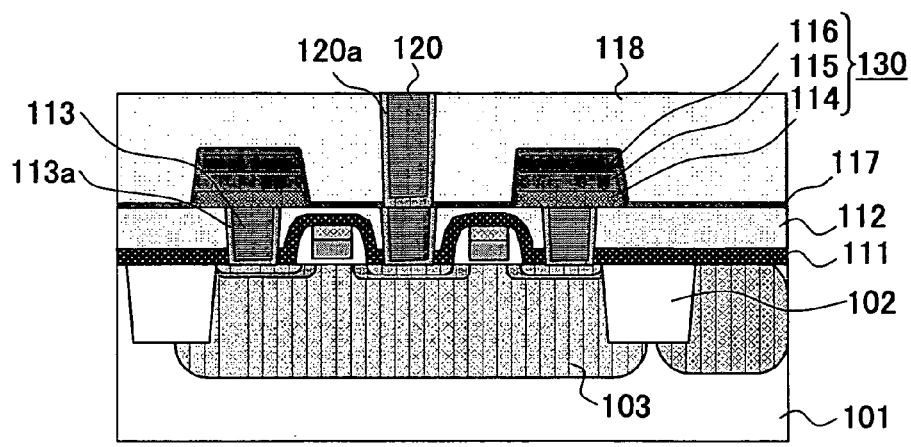
Figure 1G:
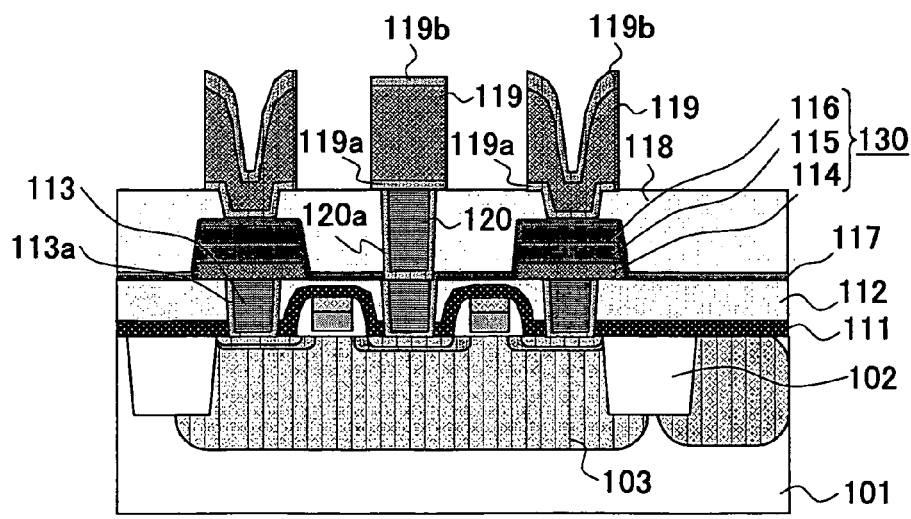
Figure 2:
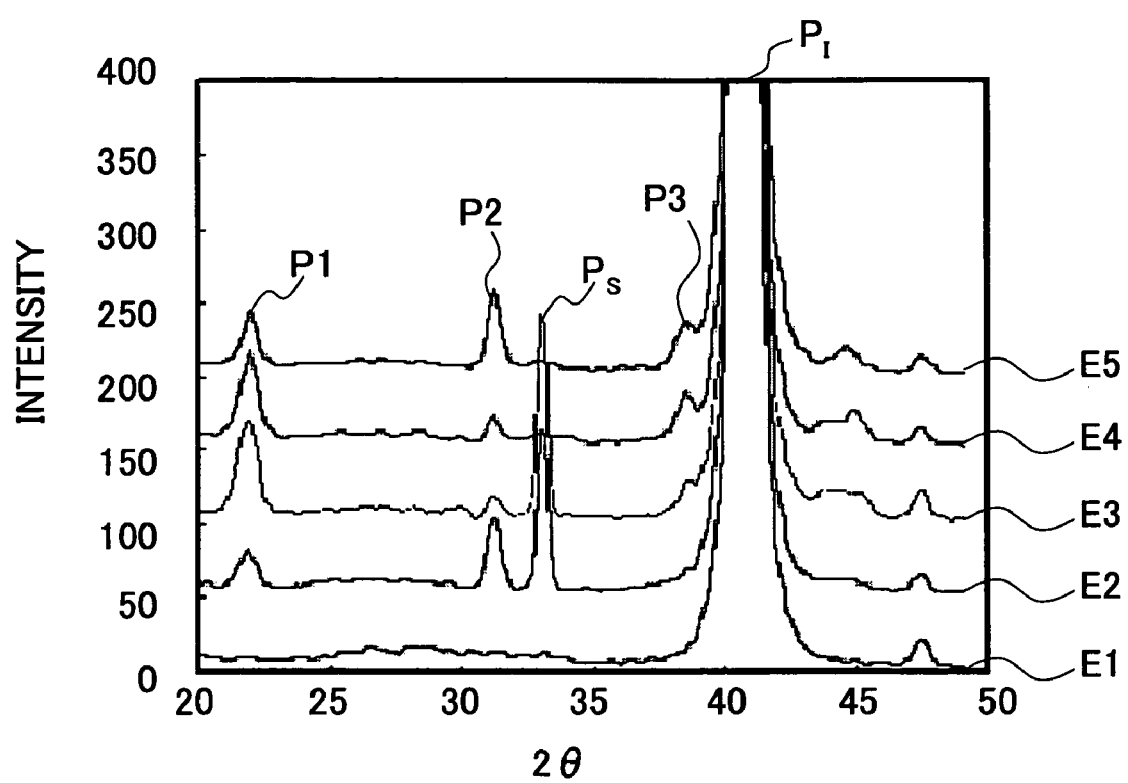
FIG. 2 is a graph representing X ray analysis profiles of PZT films formed on an Ir electrode at different film deposition temperatures using the MOCVD method.
Figure 3:
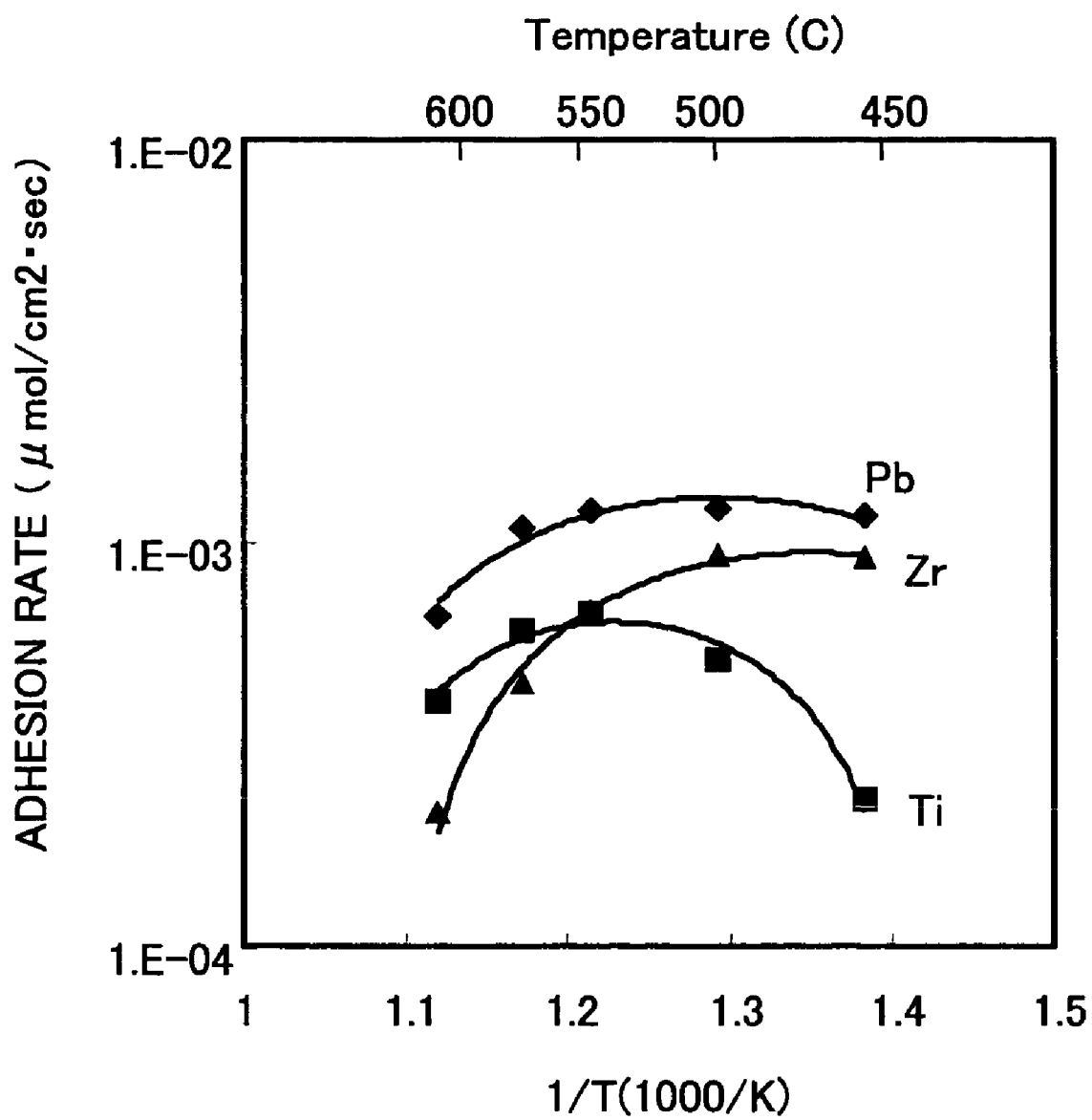
FIG. 3 is a graph representing substrate adhesion rates of a source gas including PB, a source gas including Zr, and a source gas including Ti in relation to the film deposition temperature.

The source gases supplied to the heated substrate 11 are thermally decomposed to form the PZT film. The film deposition temperature in this process is set to be greater than or equal to 600° C. In the present example, it is assumed that the film deposition temperature is set to 620° C. As is explained in relation to FIG. 2, when the film deposition temperature for forming the PZT film is set to a high temperature of 600° C. or above, the (111) orientation ratio in the PZT film being formed may be increased.

Figure 4C:
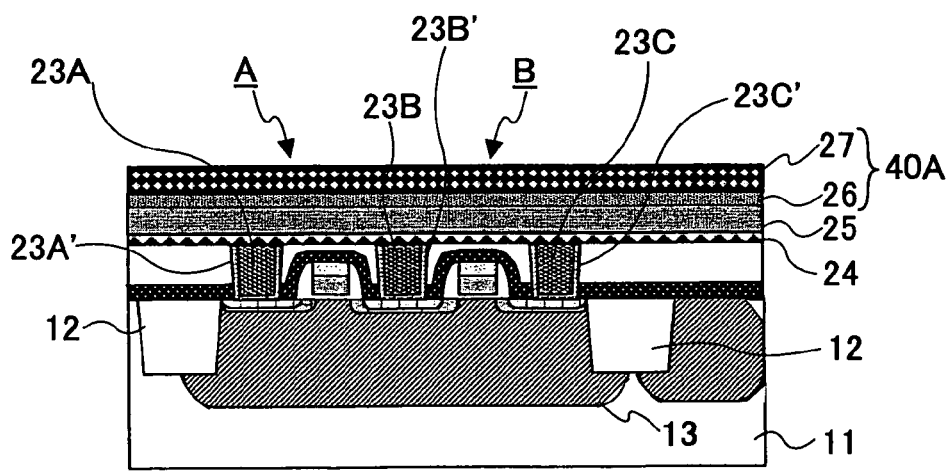

Next, referring to FIG. 4C, a second film deposition step for forming a second ferroelectric film 27 is conducted according to procedures similar to those of the first film deposition step described in relation to FIG. 4B. It is noted that first ferroelectric film 26 and the second ferroelectric film 27 realize a ferroelectric structure 40A.

According to the present example, in the second film deposition step, the source including Pb is supplied at 0.376 ml/min, the source including Zr is supplied at 0.277 ml/min, and the source including Ti is supplied at 0.214 ml/min for a period of 420 seconds.

Then, the source gases supplied to the heated substrate 11 are thermally decomposed to form the PZT film. It is noted that in the second film deposition step, the film deposition temperature is set to be greater than or equal to 500° C. but less than 600° C. In other words, the film deposition temperature in the second film deposition step is arranged to be lower than the film deposition temperature of the first film deposition step. In the present example, it is assumed that the film deposition step of the second film deposition step is set to 500° C.

Accordingly, decomposition of the source gases in the vapor phase may be prevented, the generation of impurities such as particles and decomposition products in the vapor phase may be prevented, and the integration of impurities into the ferroelectric film being formed may be prevented, for example. In this way, a high quality ferroelectric film including little impurities and particles may be formed.

Also, since the film deposition temperature of the second film deposition step is set to a lower temperature of less than 600° C., for example, separation of Pb and/or O from the PZT film may be prevented, and crystal defects such as a Pb deficit and/or an O deficit may be prevented. In this way, a ferroelectric film with few crystal defects may be formed. In turn, a ferroelectric film with good electric characteristics, and a reduced leak current may be formed.

It is noted that in the ferroelectric structure 40A, the second ferroelectric film 27 is arranged to be thicker than the first ferroelectric film 26, and thereby, the ferroelectric structure 40A has substantially the same characteristics as those of the second ferroelectric film 27. For example, the ferroelectric structure 40A may be arranged to have little impurities, few crystal defects, and a low leak current.

Also, since the first ferroelectric film 26 with a high (111) orientation ratio in the PZT film is formed in the first film deposition step, the second ferroelectric film 27 formed on top of the first ferroelectric film 26 may also have a high (111) orientation ratio that is substantially equivalent to that of the first ferroelectric film 26.

Accordingly, even when the film deposition temperature for forming the second ferroelectric film 27 is set to greater than or equal to 500° C. but less than 600° C., the second ferroelectric film 27 may be arranged to have a high (111) orientation ratio. Thus, a high (111) orientation ration may be realized in both the first ferroelectric film 26 and the second ferroelectric film 27, and in turn, a large self polarization effect and good ferroelectric characteristics may be realized in the ferroelectric structure 40A. Also, good imprint characteristics may be realized in the ferroelectric capacitor implementing the ferroelectric structure 40A, and reliability of the ferroelectric memory using the ferroelectric structure 40A may be improved.

It is noted that in order to realize an increase in the (111) orientation rate of the second ferroelectric film 27, the first ferroelectric film 26 needs to have a thickness of 3 nm or greater.

In the present example, the first ferroelectric film 26 is arranged to have a thickness of 5 nm, and the second ferroelectric film 27 is arranged to have a thickness of 115 nm so that the total thickness of the ferroelectric structure may amount to 120 nm. Also, upon examining the PZT film formed in the above-described manner, it has been found that:

$$Pb/(Zr+Ti)=1.17$$

and $$Zr(Zr+Ti)=0.43.$$

Figure 4D:
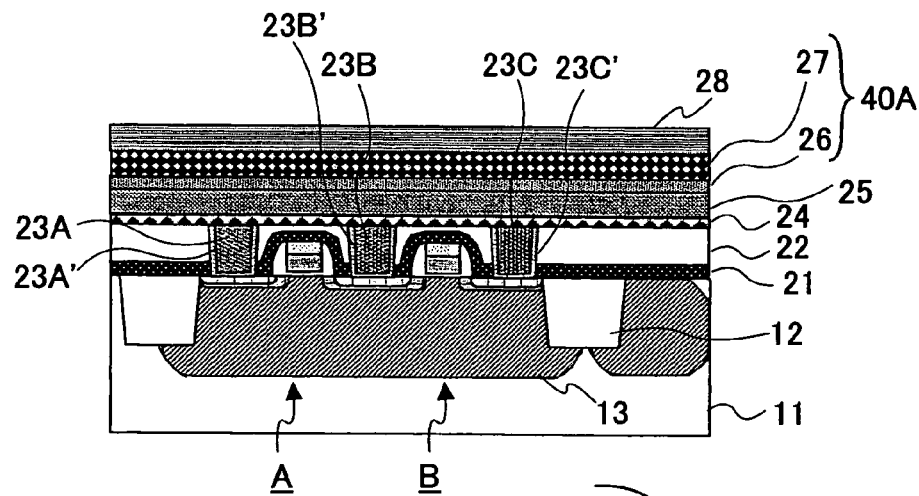

Next, referring to FIG. 4D, an iridium oxide (IrOx) film 28 having a thickness of 200 nm for forming an upper electrode is formed through reactive sputtering, for example.

Figure 4E:
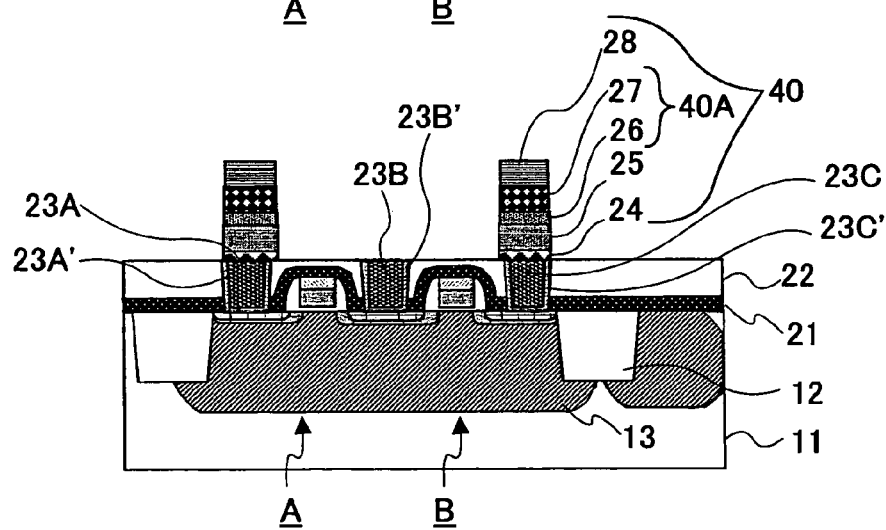

Then, referring to FIG. 4E, an etching process is conducted on the IrOx film 28, the second ferroelectric film 27, the first ferroelectric film 26, the Ir film 25, and the Ti film 24 to form a ferroelectric capacitor 40.

The ferroelectric capacitor 40 includes a lower electrode that is formed by the Ti film 24 and the Ir film 25, the ferroelectric structure that is formed by the first ferroelectric film 26 and the second ferroelectric film 27, and an upper electrode formed by the IrOx film 28. In the present example two ferroelectric capacitors 40 are formed on the contact plug 23A and the contact plug 23C, respectively, and the Ti films 24 of the two ferroelectric capacitors 40 are electrically connected to the contact plugs 23A and 23C, respectively.

Figure 4F:
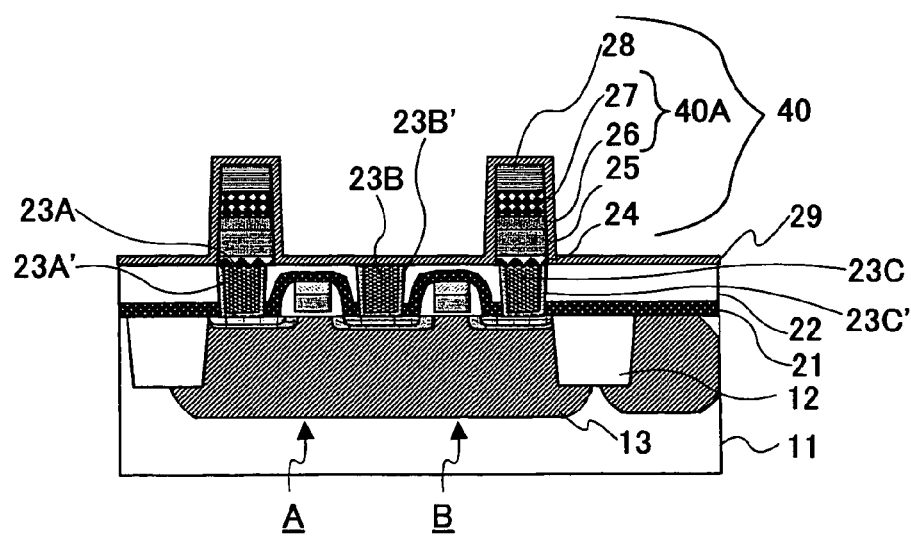

Next, referring to FIG. 4F, a protective film 29 that is made of PZT film, for example, is formed to cover the interlayer insulating film 22 and the ferroelectric capacitor 40.

Figure 4G:
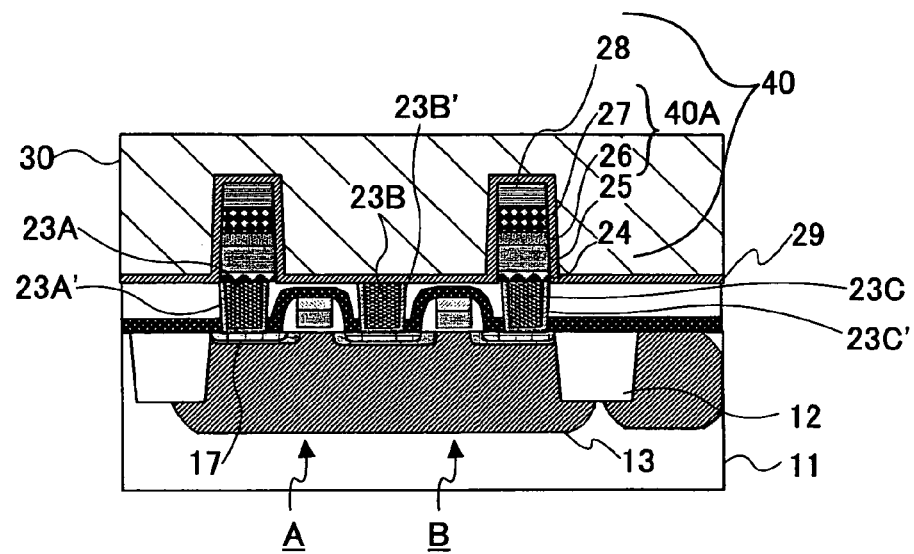

Next, referring to FIG. 4G, an interlayer insulating film 30 that is made of a silicon oxide ($SiO_2$) film, for example, is formed to cover the protective film 29, and the interlayer insulating film 30 is then smoothed through CMP (chemical mechanical polishing).

Figure 4H:
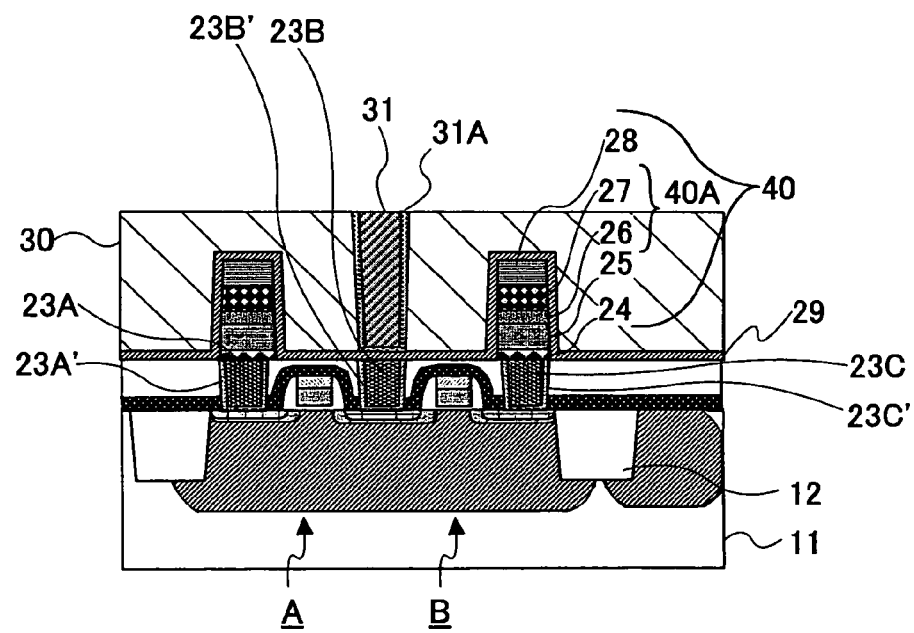

Next, referring to FIG. 4H, a contact hole is formed through dry etching on a portion of the smoothed interlayer insulating film 30 corresponding to the contact plug 23B, and Ti and TiN are formed on the surface of the contact hole and the interlayer insulating film 30 through sputtering, for example, to form a barrier film 31A having a TiN/Ti structure.

Then, a contact plug 31 that is made of W (tungsten), for example, is formed on the barrier film 31A. Then, the TiN/Ti and the W formed on the interlayer insulating film 30 are removed through CMP to form a contact plug 31 that is electrically connected to the contact plug 23B.

Figure 4I:
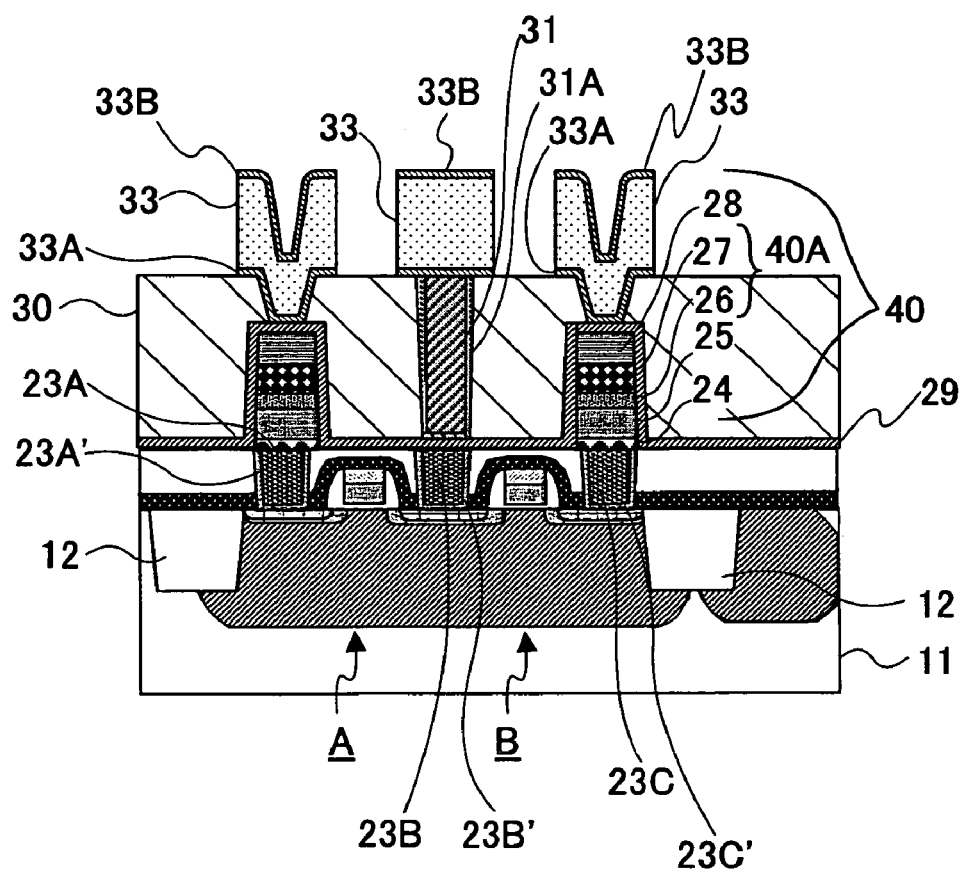

Next, referring to FIG. 4I, a contact hole is formed through dry etching on a portion of the interlayer insulating film 30 corresponding to the upper electrode 28 (e.g., two contact holes are formed at regions of the interlayer film 30 corresponding to the two upper electrodes 28 in the illustrated example). Then, a barrier film 33A having a TiN/Ti structure is formed on the interlayer insulating film 30 and the contact hole(s) through sputtering, and a wiring portion 33 made of Al—Cu is formed on the barrier film 33A through sputtering. Then, a TiN/Ti barrier film 33B is formed on the wiring portion 33, after which an etching process is conducted to form a wiring layer on the interlayer insulating film 30.

Further, a multilayer wiring structure is formed on the wiring layer to realize a semiconductor device including a ferroelectric memory.

It is noted that in the illustrated example, a ferroelectric structure 40A that is made of a PZT film is described. However, the present invention is not limited to using a PZT film to realize the ferroelectric structure, and for example, a $PbTiO_3$ (PT) film may be used to realize the ferroelectric structure as well. In another example, the ferroelectric structure may be realized by a combination of a PZT film and a PT film.

Also, it is noted that since the film deposition temperature of the second film deposition step is set to a low temperature below 600° C., the amount of heat applied to the semiconductor device including the ferroelectric capacitor 40 may be relatively small. Thereby, the state of the semiconductor device such as the impurity dispersion states of the high concentration impurity dispersion regions 17A~17C may be protected from being influenced by such heat.

Also, it is noted that in the process as is illustrated by FIG. 4C, the film deposition temperature for forming the second ferroelectric film 27 is set to be greater than or equal to 500° C. but less than 600° C. However, the present invention is not limited to such an example, and for example, the film deposition temperature for forming the second ferroelectric film may be set to be greater than or equal to 400° C. but less than 500° C. In this case, as is descried in relation to FIG. 2, the second ferroelectric film is formed into a non-crystalline film. Thereby, a crystallization process such as a lamp annealing process for heating the second ferroelectric film to induce its crystallization may be conducted to obtain a ferroelectric film having identical characteristics as the second ferroelectric film 27 formed at a film deposition temperature that is greater than or equal to 500° C. but less than 600° C. as is described in relation to FIG. 4C.

In the case of forming a non-crystalline PZT film and conducting an annealing process on the PZT film to induce its crystallization, the amount of heat applied to the substrate may be reduced compared to the case of forming a crystallized PZT film at a high film deposition temperature since the time duration for applying a high temperature may be reduced. Accordingly, damage that is inflicted on the semiconductor device such as a MOS transistor due to heat may be reduced.

It is noted that the above technique is particularly useful in a case where the wiring design rule is set to 100 nm or below. Specifically, when the wiring design rule is set to 100 nm or below, for example, the heat dispersion temperature for forming the impurity dispersion region of the MOS transistor has to be set to 600° C. or below, and thereby, a method of forming a ferroelectric capacitor that does not impose an influence on the impurity dispersion region of the MOS transistor formed in the above manner at a temperature of 600° C. or below may be useful.

Figure 5:
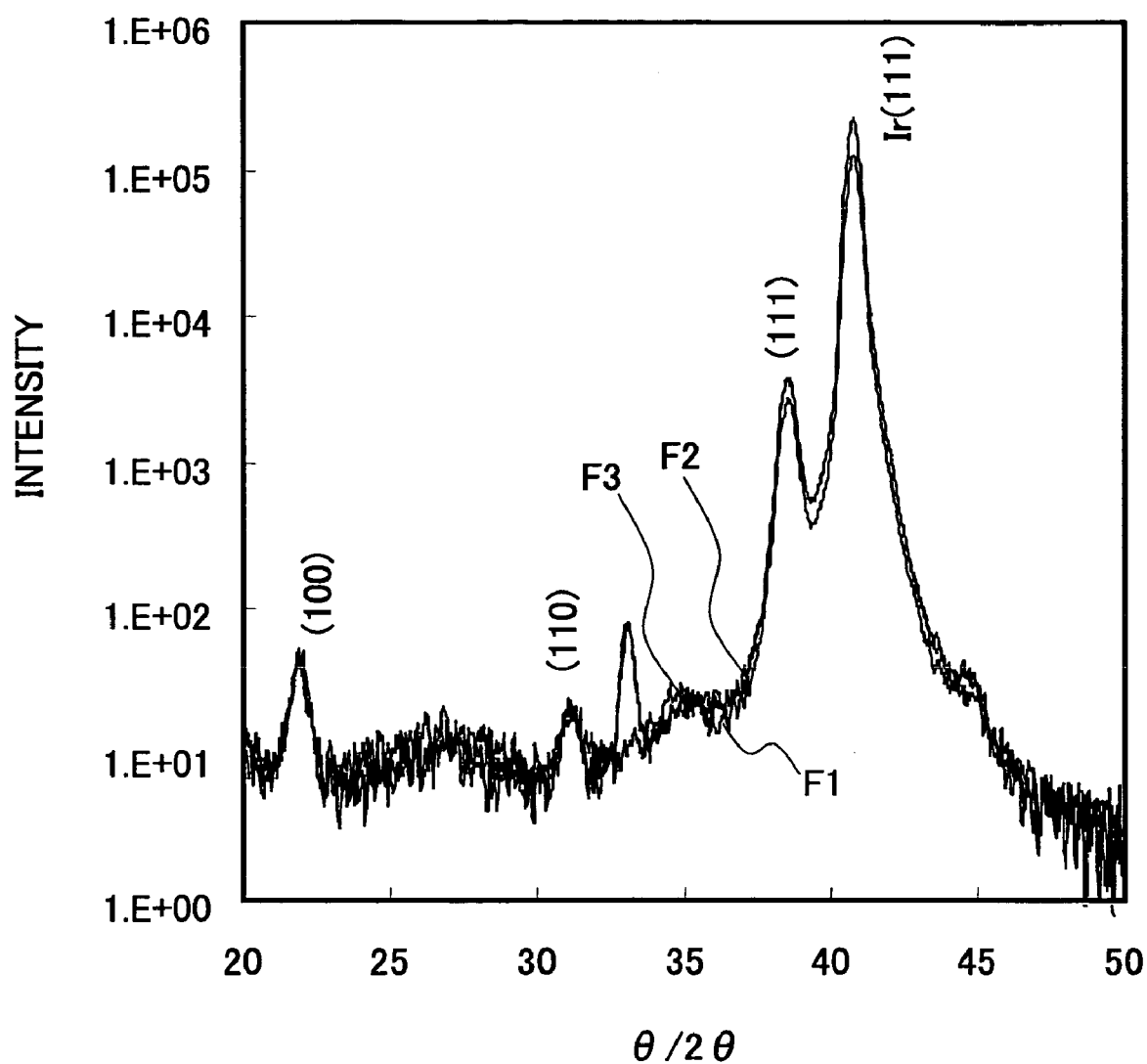
FIG. 5 is a graph representing X ray analysis profiles of PZT films formed on an Ir electrode at different film deposition temperatures using the MOCVD method.

FIG. 5 is a graph representing experimental results pertaining to the orientations of the ferroelectric structure 40A. Specifically, FIG. 5 represents X ray analysis profiles of the ferroelectric structure 40A formed at different film deposition temperatures. In FIG. 5, a result of an experiment F2 in which the film deposition temperature for forming the second ferroelectric film 27 was set to 500° C., and a result of an experiment F3 in which the film deposition temperature for forming the second ferroelectric film 27 was set to 550° C. are shown. Also, a result of an experiment F1 in which the film deposition temperature for forming both the first ferroelectric film 26 and the second ferroelectric film 27 was set to 620° C. is shown as a comparison example.

As is shown in FIG. 5, the experiments F2 and F3 show results identical to that obtained from the experiment F1 in which the film deposition temperature for forming both the first and second ferroelectric films is set to 620° C. Specifically, in all the experiments F1, F2, and F3, a high (111) orientation ratio of 90% or above is achieved in the PZT film being formed.

As can be appreciated from the above descriptions, in a ferroelectric structure realized by a first ferroelectric film and a second ferroelectric film, when the film deposition temperature for forming the first ferroelectric film is set to 600° C. or higher, a high (111) orientation ratio in the PZT film may be secured even when the film temperature for forming the second ferroelectric film is set below 600° C. That is, a (111) orientation ratio of 90% or higher may be secured in the PZT film as in the case where the film deposition temperature for forming both the first and second ferroelectric films is set to 600° C. or higher to thereby realize a ferroelectric structure having good ferroelectric characteristics.

SECOND EMBODIMENT

In the following, a second embodiment of the present invention is described. It is noted that the second embodiment corresponds to a modification of the first embodiment in which a ferroelectric capacitor having a planar structure is implemented in a semiconductor device.

Figure 6:
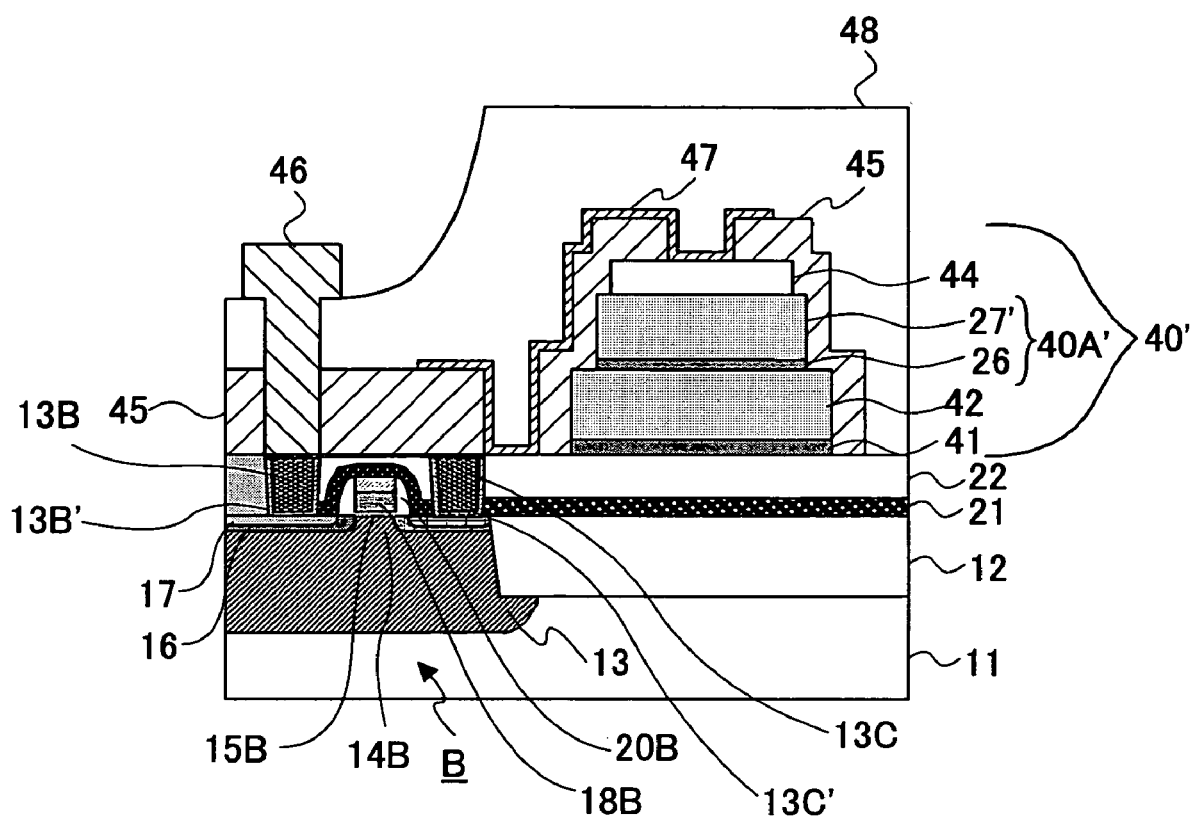
FIG. 6 is a diagram showing a configuration of a semiconductor device including a ferroelectric capacitor according to a second embodiment of the present invention.

FIG. 6 is a diagram showing a configuration of a semiconductor device including a ferroelectric capacitor having a planar structure according to the second embodiment. It is noted that in this drawing, elements that are identical to those described in relation to the first embodiment are given the same numerical references and their descriptions are omitted.

In FIG. 6, an aluminum oxide (AlxOy) film 41 and an Ir film 42 are formed on the interlayer insulating film 22 to form a lower electrode having an Ir/AlxOy structure.

A first ferroelectric film 26 that is made of a PZT film, for example, is formed on the Ir film 42, and a second ferroelectric film 27' is formed on the first ferroelectric film 26. The first ferroelectric film 26 and the second ferroelectric film 27' realize a ferroelectric structure 40A'.

An iridium oxide (IrOx) film 44 is formed on the second ferroelectric film 27' to realize an upper electrode. It is noted that the AlxOy film 41, the Ir film 42, the ferroelectric structure 40A', and the IrOx film 44 that are formed on the interlayer insulating film 22 realize a ferroelectric capacitor 40'.

An insulating film 45 is formed to cover the ferroelectric capacitor 40' and the interlayer insulating film 22, and an interlayer insulating film 48 is formed to cover the interlayer film 45. A contact hole is formed at a portion of the insulating film 45 and the interlayer insulating film 48 corresponding to the contact plug 13B, and a wiring portion 46 that is electrically connected to the contact plug 13B is formed at the contact hole.

Another contact hole is formed at a portion of the interlayer insulating film 45 corresponding to the contact plug 13C, and a wiring portion 47 that is made of TiN, for example, is formed over the contact hole. The wiring portion 47 is electrically connected to the contact plug 13C, and is formed to cover the insulating film 45 to be electrically connected to the IrOx film 44.

FIGS. 7A~7E are diagrams illustrating process steps for forming the semiconductor device of FIG. 6. It is noted that in these drawings, elements that are identical to those described in relation to the first embodiment are given the same numerical references and their descriptions are omitted.

Figure 7A:
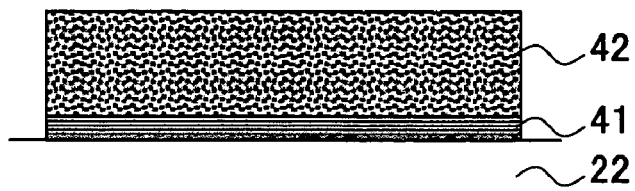
FIG. 7A~7E are diagrams illustrating process steps of a method for fabricating the semiconductor device including a ferroelectric capacitor shown in FIG. 6.

According to the present example, first, in the process step as is illustrated by FIG. 7A, the AlxOy film 41 is formed on the interlayer insulating film 22, and the It film 42 is formed on the AlxOy film 41 through sputtering, for example.

Figure 7B:
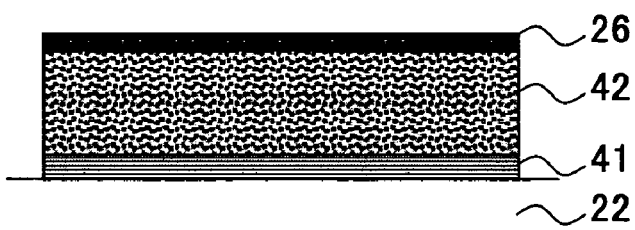

Then, in the process step as is illustrated in FIG. 7B, the first ferroelectric film 26 made of a PZT film, for example, is formed on the Ir film 42 using the MOCVD method in a manner similar to that described in relation to FIG. 4B. In the present example, $Pb(DPM)_2$ is used as a source including Pb, $Zr(dmhd)_4$ is used as a source including Zr, and $Ti(O-iPr)_2(DPM)_2$ is used as a source including Ti.

Each of the sources is dissolved by a solvent of THF (tetrahydrofuran) to a molar ratio concentration of 3% to create a source liquid, and the source liquid is vaporized by a vaporizer at a temperature of 260° C. and is mixed with oxygen to create a source gas. The source gas may be supplied to the substrate 11 via a source gas supply system having a shower head structure, for example.

In the film deposition process according to the present example, the source including Pb is supplied at 0.365 ml/min, the source including Zr is supplied at 0.196 ml/min, and the source including Ti is supplied at 0.175 ml/min for a period of 20 seconds.

The source gases supplied to the heated substrate 11 are thermally decomposed to form the PZT film. The film deposition temperature in this process is set to be greater than or equal to 600° C. In the present example, it is assumed that the film deposition temperature is set to 620° C. By setting the film deposition temperature for forming the PZT film to a high temperature of 600° C. or above, a high (111) orientation ratio in the PZT film being formed may be realized.

Figure 7C:
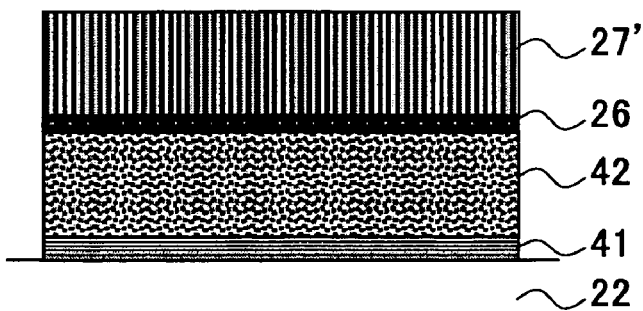

Next, in the process step as is illustrate by FIG. 7C, a second ferroelectric film 27' is formed in a manner similar to the process step described in relation to FIG. 4C to form a ferroelectric structure 40A' that is made of the first ferroelectric film 26 and the second ferroelectric film 27'. In this step, the source including Pb is supplied at 0.11 ml/min, the source including Zr is supplied at 0.02 ml/min, and the source including Ti is supplied at 0.5 ml/min for a period of 1800 seconds.

Then, the source gases supplied to the heated substrate 11 are thermally decomposed to form the PZT film. It is noted that according to the present embodiment, the film deposition temperature for forming the second ferroelectric film 27' is set to be greater than or equal to 400° C. but less than 500°

C. In the illustrated example, it is assumed that the film deposition temperature is set to 400° C. As can be appreciated from the above descriptions, the film deposition temperature for forming the second ferroelectric film is arranged to be lower than the film deposition temperature for forming the first ferroelectric film.

Accordingly, decomposition of the source gases in the vapor phase may be prevented, the generation of impurities such as particles and decomposition products in the vapor phase may be prevented, and the integration of impurities into the ferroelectric film being formed may be prevented, for example. In this way, a high quality ferroelectric film including little impurities and few particles may be formed.

It is noted that the second ferroelectric film 27' formed in the above manner has a non-crystalline structure, and thereby, a crystallization process such as a lamp annealing process has to be conducted. For example, the crystallization process may be realized by heating the substrate 11 to a temperature of 750° C. and conducting an annealing process for 60 seconds in an oxygen atmosphere to crystallize the second ferroelectric film 27'.

In the case of forming a non-crystalline PZT film and conducting an annealing process on the PZT film to induce its crystallization, the amount of heat applied to the substrate may be reduced compared to the case of forming a crystallized PZT film at a high film deposition temperature since the time duration for applying a high temperature may be reduced. Accordingly, damage that is inflicted on the semiconductor device such as a MOS transistor due to heat may be reduced.

It is noted that the above technique is particularly useful in a case where the wiring design rule is set to 100 nm or below. Specifically, when the wiring design rule is set to 100 nm or below, for example, the heat dispersion temperature for forming the impurity dispersion region of the MOS transistor has to be set to 600° C. or below, and thereby, a method of forming a ferroelectric capacitor that does not impose an influence on the impurity dispersion region of the MOS transistor formed in the above manner at a temperature of 600° C. or below may be useful.

Also, since the amount of heat applied to the substrate may be relatively small in this example, separation of Pb and/or O from the PZT film may be prevented, and crystal defects such as a Pb deficit and/or an O deficit may be prevented. In this way, a ferroelectric film with little crystal defects may be formed. In turn, a ferroelectric film with good electric characteristics, and a reduced leak current may be formed.

It is noted that in the ferroelectric structure 40A', the second ferroelectric film 27' is arranged to be thicker than the first ferroelectric film 26, and thereby, the ferroelectric structure 40A' has substantially the same characteristics as those of the second ferroelectric film 27'. For example, the ferroelectric structure 40A' may be arranged to have little impurities, few crystal defects, and a low leak current.

Also, since the first ferroelectric film 26 with a high (111) orientation ratio in the PZT film is formed in the first film deposition step, the second ferroelectric film 27 formed on top of the first ferroelectric film 26 may also have a high (111) orientation ratio that is substantially equivalent to that of the first ferroelectric film 26. Thereby, good ferroelectric characteristics such as a large self polarization effect and low residual polarization may be realized in the ferroelectric structure 40A'. Also, good imprint characteristics may be realized in the ferroelectric capacitor 40' implementing the ferroelectric structure 40A'.

It is noted that in order to realize an increase in the (111) orientation rate of the second ferroelectric film 27, the first ferroelectric film 26 needs to have a thickness of 3 nm or greater.

In the present example, the first ferroelectric film 26 is arranged to have a thickness of 5 nm, and the second ferroelectric film 27' is arranged to have a thickness of 115 nm so that the total thickness of the ferroelectric structure 40A' may amount to 120 nm. Also, upon examining the PZT film formed in the above-described manner, it has been found that:

Pb/(Zr+Ti)=1.14 and

Zr(Zr+Ti)=0.35.

Figure 7D:
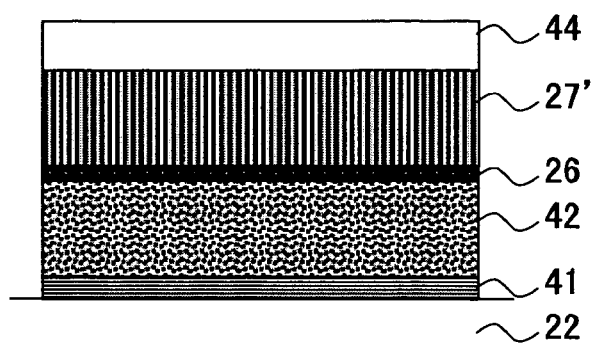

Next, in the process step as is illustrated in FIG. 7D, the iridium oxide (IrOx) film 44 having a thickness of 200 nm for forming an upper electrode is formed through reactive sputtering, for example.

Figure 7E:
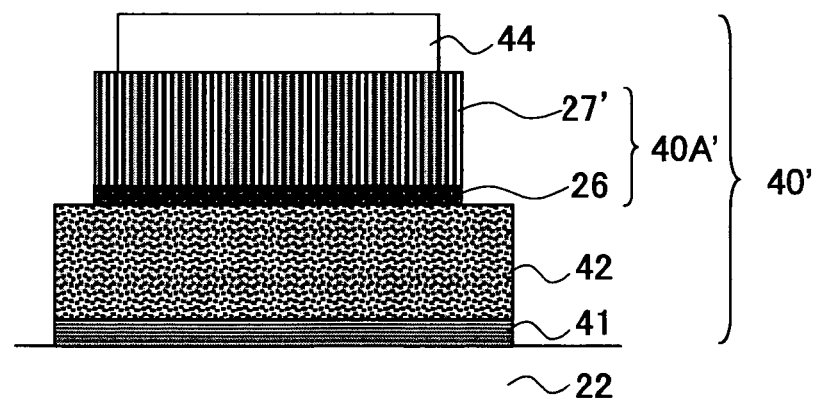

Then, in the process step as is illustrated by FIG. 7E, an etching process is conducted on the IrOx film 44, the second ferroelectric film 27', the first ferroelectric film 26, the Ir film 42, and the Ti film 41 to form the ferroelectric capacitor 40'.

Then, the insulting film 45, the wiring portions 46 and 47, and the interlayer insulating film 48 shown in FIG. 6 are formed to fabricate the semiconductor device of FIG. 6. It is noted that in FIG. 6 a multilayer wiring structure that is connected to the wiring portion 46 of the semiconductor device is omitted from the drawing.

As can be appreciated from the above descriptions, a ferroelectric capacitor having a planar structure may be used in a semiconductor device according to an embodiment of the present invention. Also, a ferroelectric capacitor having a three-dimensional stacked structure may be used in a semiconductor device according to an embodiment of the present invention.

It is noted that in the illustrated example, a ferroelectric structure 40A' that is made of a PZT film is described. However, the present invention is not limited to using a PZT film to realize the ferroelectric structure, and for example, a PbTiO$_3$ (PT) film may be used to realize the ferroelectric structure as well. In another example, the ferroelectric structure may be realized by a combination of a PZT film and a PT film.

According to an embodiment, in forming a ferroelectric structure including PZT or PT of a ferroelectric capacitor of a semiconductor device, a first ferroelectric film that is formed in a first film deposition step and a second ferroelectric film that is formed in a second film deposition step are formed into a layered structure. In the first film deposition step, the film deposition temperature for forming the first ferroelectric film is set to be greater than or equal to 600° C. In this way, the (111) orientation ratio of the first ferroelectric film may be increased, and in turn, the (111) orientation ratio of the second ferroelectric film that is formed in the second film deposition step may also be increased. Accordingly, even when the film deposition temperature in the second film deposition step is set below 600° C. to reduce impurities and crystal defects within the second ferroelectric film, the second ferroelectric film may be arranged to have a high (111) orientation ratio. Thereby, the ferroelectric structure that is made up of the first ferroelectric film and the second ferroelectric film may have a high (111) orientation ratio, good ferroelectric characteristics, little impurities, and few crystal defects so that a high quality ferroelectric capacitor may be realized.

Further, it is noted that the present invention is not limited to the specific embodiments described above, and variations and modifications may be made without departing from the scope of the present invention.

What is claimed is:

1. A method for fabricating a semiconductor device including a ferroelectric capacitor, the method comprising:
   a lower electrode forming step for forming a lower electrode of the ferroelectric capacitor;
   a first film deposition step for forming a first ferroelectric film primarily having a (111) orientation on the lower electrode through a vapor deposition process using an organic metal source;
   a second film deposition step for forming a second ferroelectric film primarily having a (111) orientation on the first ferroelectric film through a vapor deposition process using the organic metal source; and
   an upper electrode forming step for forming an upper electrode on the second ferroelectric film; wherein
   the first ferroelectric film and the second ferroelectric film include at least one of Pb $(Zr_x, Ti_{1-x})O_3$ and $PbTiO_3$; and
   a film deposition temperature of the first film deposition step is 600–650° C.

2. The method for fabricating a semiconductor device as claimed in claim 1, wherein
   a film deposition temperature of the second film deposition step is set to be greater than or equal to 500° C. and less than 600° C.

3. The method for fabricating a semiconductor device as claimed in claim 2, wherein
   a film thickness of the first ferroelectric film is arranged to be greater than or equal to 3 nm.

4. The method for fabricating a semiconductor device as claimed in claim 2, wherein
   the first ferroelectric film and the second ferroelectric film form a ferroelectric structure; and
   a (111) crystal orientation ratio of the ferroelectric structure is arranged to be greater than or equal to 90%.

5. The method for fabricating a semiconductor device as claimed in claim 2, wherein
   the upper electrode and the lower electrode include iridium.

6. The method for fabricating a semiconductor device as claimed in claim 5, wherein
   the lower electrode includes a titanium film and an iridium film.

7. The method for fabricating a semiconductor device as claimed in claim 5, wherein
   the lower electrode includes an aluminum oxide film and an iridium film.

8. The method for fabricating a semiconductor device as claimed in claim 1, wherein
   a film deposition temperature of the second film deposition step is set to be greater than or equal to 400° C. and less than 500° C.

9. The method for fabricating a semiconductor device as claimed in claim 8, further comprising:
   a crystallization step that is conducted after the second film deposition step for crystallizing the second ferroelectric film.

10. The method for fabricating a semiconductor device as claimed in claim 9, wherein the second ferroelectric film is crystallized by conducting a lamp annealing process.

11. The method for fabricating a semiconductor device as claimed in claim 8, wherein a film thickness of the first ferroelectric film is arranged to be greater than or equal to 3 nm.

12. The method for fabricating a semiconductor device as claimed in claim 8, wherein
   the first ferroelectric film and the second ferroelectric film form a ferroelectric structure; and
   a (111) crystal orientation ratio of the ferroelectric structure is arranged to be greater than or equal to 90%.

13. The method for fabricating a semiconductor device as claimed in claim 8, wherein
   the upper electrode and the lower electrode include iridium.

14. The method for fabricating a semiconductor device as claimed in claim 13, wherein
   the lower electrode includes a titanium film and an iridium film.

15. The method for fabricating a semiconductor device as claimed in claim 13, wherein
   the lower electrode includes an aluminum oxide film and an iridium film.

16. The method for fabricating a semiconductor device as claimed in claim 1, wherein
   the organic metal source used in the first film deposition step and the second film deposition step includes $Pb(DPM)_2$.

17. The method for fabricating a semiconductor device as claimed in claim 1, wherein
   the organic metal source used in the first film deposition step and the second film deposition step includes $Zr(d-mhd)_4$.

18. The method for fabricating a semiconductor device as claimed in claim 1, wherein
   the organic metal source used in the first film deposition step and the second film deposition step includes $Ti(O-iPr)_2(DPM)_2$.

* * * * *